United States Patent [19]

Yoshitake et al.

[11] Patent Number: 5,567,974
[45] Date of Patent: Oct. 22, 1996

[54] SEMICONDUCTOR DEVICE TO ABSORB STRAY CARRIERS

[75] Inventors: Nobuyuki Yoshitake; Shinji Takakura, both of Kanagawa, Japan

[73] Assignee: Sony Corporation, Tokyo, Japan

[21] Appl. No.: 341,229

[22] Filed: Dec. 5, 1994

[30] Foreign Application Priority Data

Dec. 21, 1993 [JP] Japan .................. 5-345293

[51] Int. Cl.$^6$ ................................. H01L 31/00
[52] U.S. Cl. .................. 257/443; 257/445; 257/446; 257/465
[58] Field of Search .................. 257/443, 446, 257/448, 445, 465

[56] References Cited

U.S. PATENT DOCUMENTS

| | | | |
|---|---|---|---|
| 4,286,123 | 8/1981 | Blomley | 179/170 T |
| 4,903,103 | 2/1990 | Yamashita et al. | 257/446 X |
| 5,252,851 | 10/1993 | Mita et al. | 257/446 |

FOREIGN PATENT DOCUMENTS

| | | | |
|---|---|---|---|
| 62-16567 | 1/1987 | Japan | 257/446 |
| 63-194356 | 8/1988 | Japan | 257/446 |
| 2196463 | 8/1990 | Japan | 257/446 |
| 3262167 | 11/1991 | Japan | 257/446 |

OTHER PUBLICATIONS

*Patent Abstracts of Japan*, No. JP56060054, Shuichi, K., "Semiconductor Integrated Circuit", May 23, 1981, vol. 005, No. 121.
*Patent Abstracts of Japan*, No. JP62071265, Shinji, N., "Memory", Apr. 1, 1987, vol. 11, No. 271.
*Patent Abstracts of Japan*, No. JP63160270, Hiroshi, N., "Semiconductor Device having Photosensor and Signal Processing Element", Jul. 4, 1988, vol. 12, No. 423.
*Patent Abstracts of Japan*, No. JP62224061, Akihisa, A., "Semiconductor Integrated Circuit Device", Oct. 2, 1987, vol. 12, No. 89.
*Patent Abstracts of Japan*, No. JP63122267, Masao, K., "Optical Sensor" May 26, 1988, vol. 12, No. 369.
*Patent Abstracts of Japan*, No. JP63131570 (in Japanese), Oct. 17, 1988, vol. 012, No. 389.

*Primary Examiner*—William Mintel
*Attorney, Agent, or Firm*—Hill, Steadman & Simpson

[57] ABSTRACT

A photo IC having a plurality of photodiodes is disclosed. A semiconductor region to absorb stray carriers is provided between the photodiodes. Stray carriers generated by incidence of light are absorbed by the semiconductor region. As a result, crosstalk between the photodiodes is reduced.

5 Claims, 9 Drawing Sheets

LARGE LEAKAGE

SMALL LEAKAGE

5,567,974

SEMICONDUCTOR DEVICE TO ABSORB STRAY CARRIERS

BACKGROUND OF THE INVENTION

1. Field of the Invention

This invention relates to a semiconductor device, and is suitable for a semiconductor device having photodiodes for receiving light.

2. Description of the Related Art

Photodetectors for optical pickup in optical disc players such as compact disc players, in general, not only have the function of receiving a laser beam reflected by a disc surface and outputting an RF signal, but also have the function of outputting a tracking error signal for making the laser beam to follow the groove on the disc and a focus error signal for focusing the laser beam at the level of the disc surface. A photodetector therefore needs to be configured to have a plurality of divisional portions.

A pattern of such a photodetector is shown in FIG. 1. As shown in FIG. 1, the photodetector has six photodiodes a, b, c, d, e and f. When outputs of the photodiodes a, b, c, d, e and f are A, B, C, D, E and F, respectively, an optical system using this photodetector, as shown in FIG. 2, irradiates three laser beams L1, L2 and L3, and outputs an RF signal by A+B+C+D, a focus error signal by (A+C)−(B+D) and a tracking error signal by E−F.

Since photodetectors are devices for converting a light signal into an electric current signal, outputs of photodetectors prepared as discrete devices are very small current signals, and are weak to noise and exhibit a high output impedance. Accordingly, signal lines from a photodetector to a signal processing IC in the subsequent stage need a low-noise design which, in general, is much complicated. To remove this problem, many efforts are being made in recent years to incorporate a photodetector and a subsequent signal processing IC 10 as shown in FIG. 3 to obtain stable output signals.

To incorporate a photodetector and an IC in a single chip, the photodetector needs to be made in the wafer process of the IC. Therefore, optimum design of photodetectors is difficult, and photodetectors incorporated into IC's are often inferior to those prepared as discrete devices. This problem is discussed below in greater detail.

With the optical system shown in FIG. 2, an RF signal and a focus signal are obtained from the central laser beam L1, and a tracking error signal is obtained from the laser beams L2 and L3 at opposite sides. Therefore, if crosstalk among the photodiodes a, b, c, d, e and f is large, it may cause mixture of the focus error signal into the tracking error signal or other undesirable phenomenon.

As shown in FIG. 4, a discrete photodetector comprises a $p^+$-type semiconductor substrate 1 with a high impurity concentration, and $n^-$-type semiconductor layers 2 and 3 lying on the $p^+$-type semiconductor substrate 1, so that the $n^-$-type semiconductor layer 2 and the $p^+$-type semiconductor substrate 1 make a photodiode while the $n^-$-type semiconductor layer 3 and the $p^+$-type semiconductor substrate 1 make another photodiode. Since the $n^-$-type semiconductor layers 2 and 3 are separated by a $p^+$-type isolation region 4 with a high impurity concentration, crosstalk between the photodiodes is small.

In the IC wafer process, however, as shown in FIG. 5, a p-type semiconductor substrate 11 with a low impurity concentration is used to improve characteristics of transistors and other integrated devices, and $n^-$-type semiconductor layers 12 and 13 are made on the p-type semiconductor substrate 11. As a result, even with a $p^+$-type isolation region 14 with a high impurity concentration interposed between the $n^-$-type semiconductor layers 12 and 13, stray carriers (electron-hole pairs) generated in the p-type semiconductor substrate 11 due to incidence of light have long lifetimes and hence increase the crosstalk between the photodiodes.

OBJECTS AND SUMMARY OF THE INVENTION

It is, therefore, an object of the invention to provide a semiconductor device capable of reducing crosstalk between photodiodes even incorporated with an integrated electronic circuit into a single chip.

According to an aspect of the invention, there is provided a semiconductor device comprising a semiconductor body of a first conductivity type, a plurality of semiconductor layers of a second conductivity type provided on the semiconductor body of the first conductivity type and isolated from each other, and the semiconductor body of the first conductivity type and the semiconductor layers of the second conductivity type making a plurality of photodiodes, wherein a semiconductor region of the second conductivity type is provided between at least one pair of adjacent ones of the semiconductor layers of the second conductivity type to absorb stray carriers.

In the semiconductor device according to the invention, semiconductor layers of the first conductivity type with a higher impurity concentration than that of the semiconductor body of the first conductivity type are preferably provided between the semiconductor layers of the second conductivity type and the semiconductor body of the first conductivity type.

According to another aspect of the invention, there is provided a semiconductor device comprising semiconductor body of a first conductivity type, a first semiconductor layer of a second conductivity type provided on the semiconductor body of the first conductivity type, a plurality of second semiconductor layers of the second conductivity type provided on the first semiconductor layer of the second conductivity type and isolated from each other, a plurality of semiconductor layers of the first conductivity type respectively provided in the second semiconductor layers of the second conductivity type, the second semiconductor layers of the second conductivity type and the semiconductor layers of the first conductivity type making a plurality of photodiodes, and the first semiconductor layer of the second conductivity type having a higher impurity concentration than that of the second semiconductor layers of the second conductivity type, wherein a semiconductor region of the first conductivity type is provided between at least one pair of adjacent ones of the second semiconductor layers of the second conductivity type to absorb stray carriers.

In a preferred embodiment of the semiconductor device according to the invention, the first conductivity type is p-type, and the second conductivity type is n-type.

In the semiconductor device according to the first aspect of the invention, stray carriers, if any in the semiconductor body due to incidence of light, can be absorbed by the semiconductor region of the second conductivity type provided between the semiconductor layers of the second conductivity type, and crosstalk between the photodiodes can be reduced.

Furthermore, lifetimes of stray carriers can be shortened by the semiconductor layers of the first conductivity type with a higher impurity concentration than that of the semiconductor body of the first conductivity type provided between the semiconductor layers of the second conductivity type and the semiconductor body of the first conductivity type, and the crosstalk between the photodiodes can be reduced more.

In the semiconductor device according to the second aspect of the invention, stray carriers, if any in the semiconductor body due to incidence of light, can be absorbed by the semiconductor region of the first conductivity type provided between the semiconductor layers of the second conductivity type, and the crosstalk between the photodiodes can be reduced.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
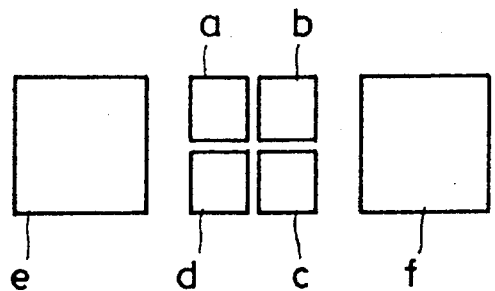
FIG. 1 is a plan view showing a pattern of photodiodes on a light-receiving surface of an existing photodetector.
Figure 2:
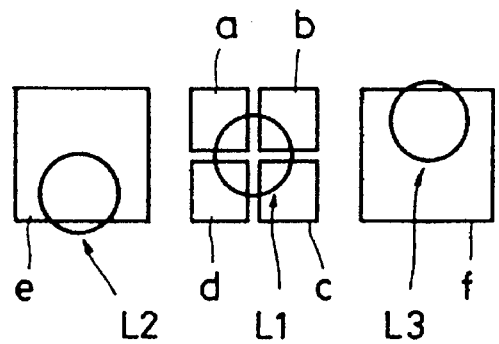
FIG. 2 is a plan vice showing the existing photodetector of FIG. 1 with laser beams irradiated to the light-receiving surface.
Figure 3:
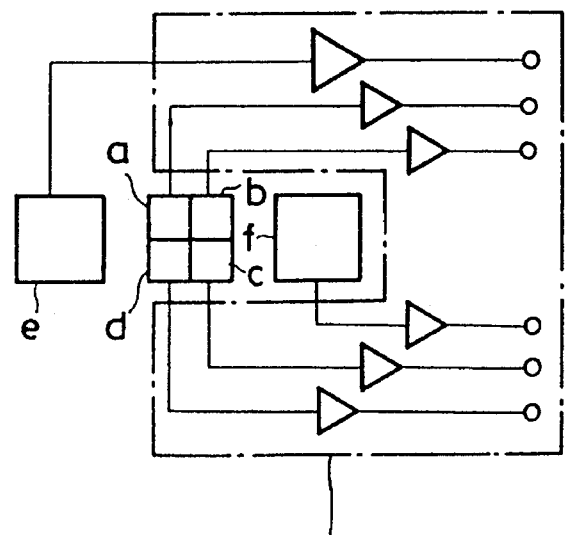
FIG. 3 is a schematic view showing i construction of a photo IC with a photodetector and a subsequent signal processing circuit incorporated into a single chip.
Figure 4:
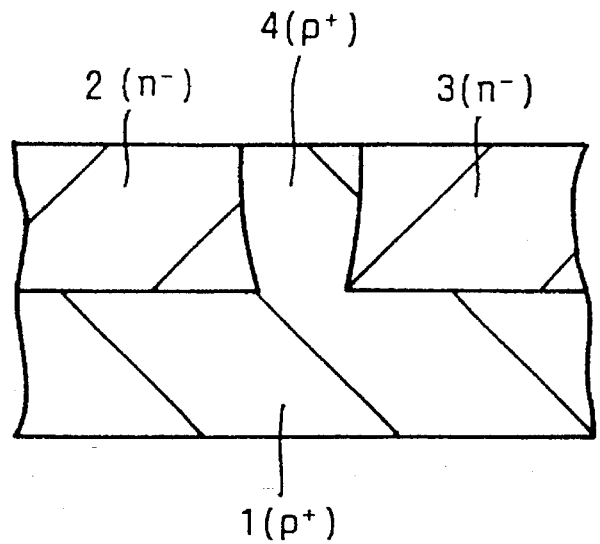
FIG. 4 is a cross-sectional view showing an existing discrete photodetector.

Embodiments of the invention will be described below with reference to the drawings. In all figures illustrating the embodiments, identical or equivalent portions are labelled with common reference numerals.

Figure 6:
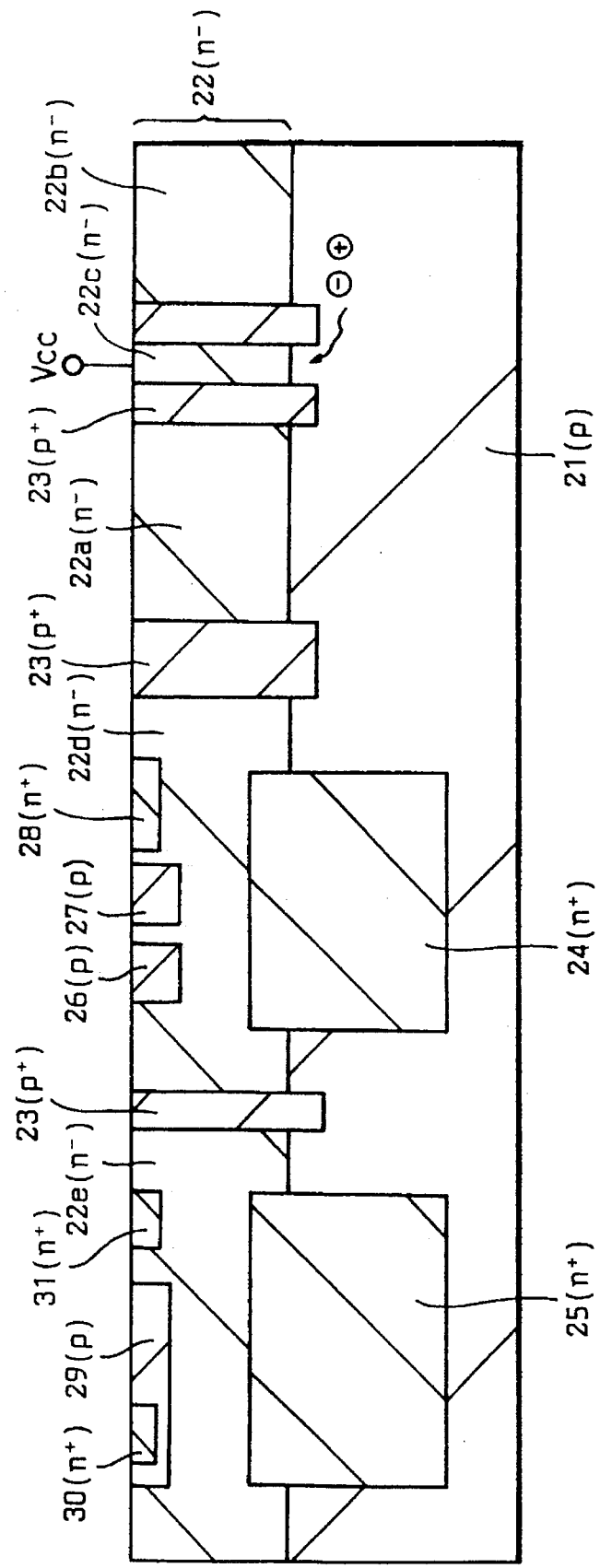
FIG. 6 is a cross-sectional view showing construction of a photo IC according to a first embodiment of the invention.

FIG. 6 is a cross-sectional view showing construction of a photo IC according to a first embodiment of the invention.

As shown in FIG. 6, in the photo IC according to the first embodiment, an $n^-$-type epitaxially grown layer 22 is made on a p-type semiconductor substrate 21. Selectively provided in the $n^-$-type epitaxially grown layer 22 are $p^+$-type isolation regions 23 to divide the $n^-$-type epitaxially grown layer 22 into a plurality of divisional portions.

In the photodetector portion of the photo IC, the $n^-$-type epitaxially grown layers 22a and 22b divided by the $p^+$-type isolation region 23 cooperate with the p-type semiconductor substrate 21 to make photodiodes. In this case, the $n^-$-type epitaxially grown layers 22c located between the $n^-$-type epitaxially grown layers 22a and 22b via the $p^+$-type isolation region 23 behaves as a stray carrier absorbing region. The stray carrier absorbing region is coupled to a positive power source $V_{cc}$.

Only two photodiodes are illustrated in FIG. 6. Actually, however, six photodiodes having a common anode (p-type semiconductor substrate 21) are provided in a pattern as shown in FIG. 1. Two photodiodes shown in FIG. 6 correspond to the photodiodes e and d, for example, in FIG. 1.

Provided on the p-type semiconductor substrate 21 in the electronic circuit portion are $n^+$-type buried layers 24 and 25. In an $n^-$-type epitaxially grown layer 22d located on the $n^+$-type buried layer 24 and isolated by the $p^+$-type isolation region 23, p-type semiconductor regions 26 and 27 and an $n^+$-type semiconductor region 28 are made. The p-type semiconductor regions 26 and 27 cooperate with a portion of the $n^-$-type epitaxially grown region 22d between them to make a lateral pnp transistor. The $n^+$-type semiconductor region 28 is used as the base contact layer of the transistor.

In an $n^-$-type epitaxially grown layer 22e located on the $n^+$-type buried layer 25 and isolated by the $p^+$-type isolation region 23, a p-type semiconductor layer 29 and $n^+$-type semiconductor layers 30 and 31 are made. The $n^+$-type semiconductor region 30, p-type semiconductor region 29 and $n^-$-type epitaxially grown layer 22e make an npn transistor. The $n^+$-type semiconductor region 31 is used as the collector layer of the transistor.

In the first embodiment, the $n^-$-type epitaxially grown layer 22 is 4.2 μm thick, for example, the $p^+$-type isolation region 23 in the photodetector portion is 6 μm wide, for example, and the $n^-$-type epitaxially grown layer 22c behaving as the stray carrier absorbing region is 20 μm wide, for example. Impurity concentration of the $n^-$-type epitaxially grown layer 22 is $10^{15}$~$10^{16}$ cm$^{-3}$, for example.

In the photo IC according to the first embodiment as shown in FIG. 6, even when stray carriers are generated in the p-type semiconductor substrate 21 in the location of one of the photodiodes due to incidence of light, the $n^-$-type epitaxially grown layer 22c, coupled to the positive power source $V_{cc}$ and behaving as the stray carrier absorbing region, absorbs electrons of the stray carriers and effectively prevents these stray electrons from reaching adjacent photodiodes. Thus the crosstalk between adjacent photodiodes is reduced, and the problem that the focus error signal mixes into the tracking error signal, or the like, can be removed.

Reduction of crosstalk between photodiodes of the photodetector contributes to a reduction of invalid components from an input signal to the integrated circuit for signal processing provided in the subsequent stage of the photodetector. Furthermore, since the crosstalk is suppressed even with small distances between adjacent photodiodes, the chip size and the package size can be reduced. In addition, margin in designing optical pickup in compact disc players, etc. is increased. It is also possible to make a photodetector with little crosstalk simultaneously and together with an integrated circuit in a common chip without substantial changes in the wafer process of the integrated circuit.

Profiles of output voltages from photodetectors responsive to irradiation of laser beams are shown as follows for an existing photo IC and the photo IC according to the first embodiment.

Figure 7:
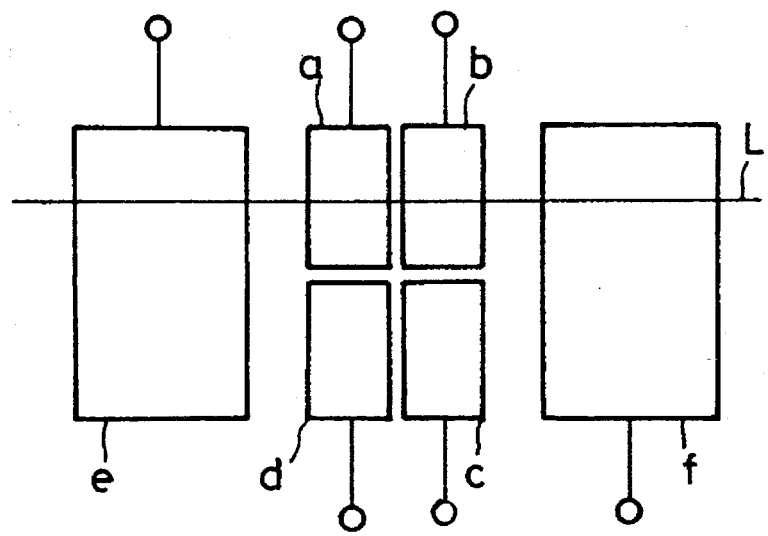
FIG. 7 is a plan view of photodiodes, identifying where to measure output voltage profiles of the photodiodes by irradiation of laser beams.
Figure 8:
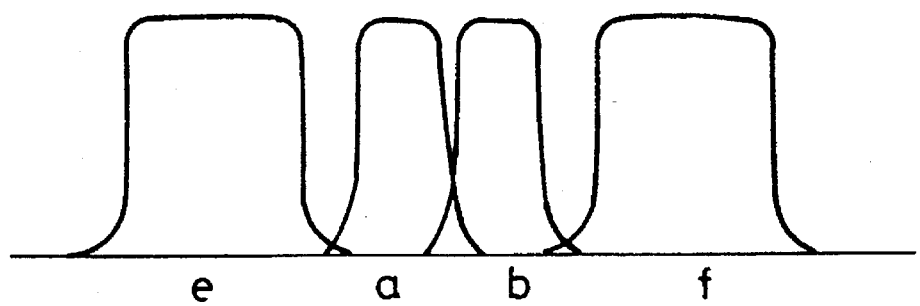
FIG. 8 is a schematic view of output voltage profiles of the photodiodes by irradiation of laser beams.

When a laser beam scans the light-receiving surface of a photodetector as shown in FIG. 7 along a straight line L extending across photodiodes e, a, b and f, signals as shown in FIG. 8 are output from output terminals of the photodiodes e, a, b and f.

Figure 5:
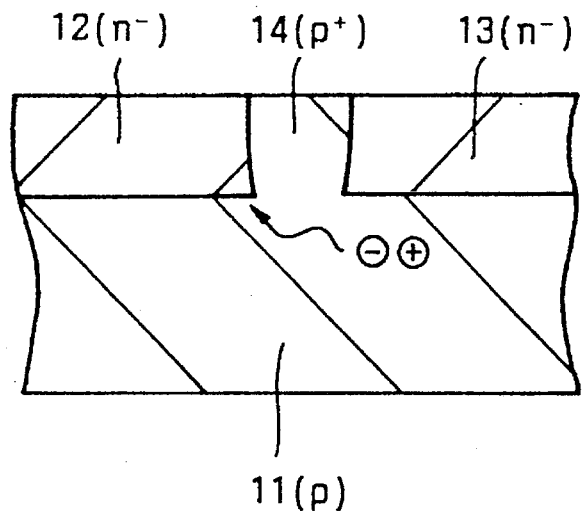
FIG. 5 is a cross-sectional view of a photodetector portion of an existing photo IC.
Figure 9A:
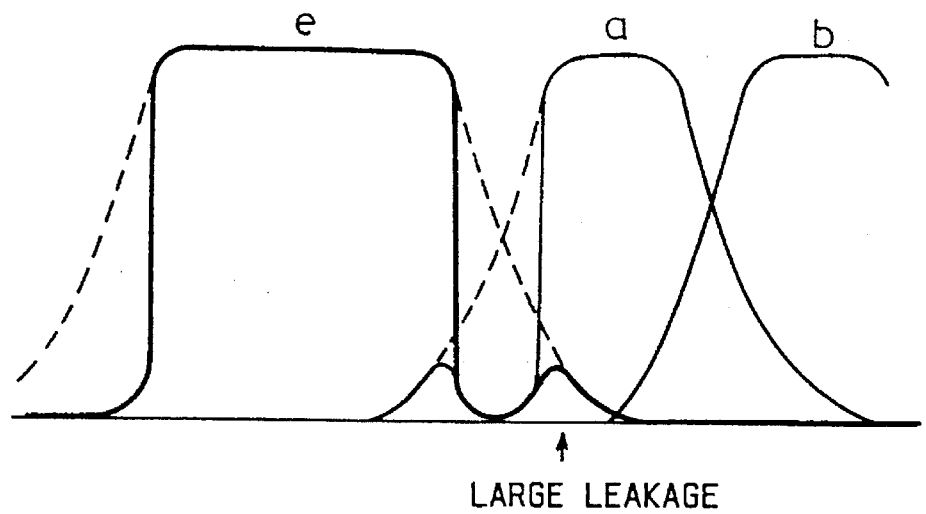
FIGS. 9A and 9B are schematic views showing output voltage profiles of photodiodes in an existing photo IC and output voltage profiles of the photodiodes in the photo IC according to the first embodiment of the invention, respectively.

Output voltages from the existing photodiodes (see FIG. 5) made in an IC process have the profiles shown in FIG. 9A. As shown in FIG. 9A, the output voltage profiles of the respective photodiodes trail the skirt. Actually, however, since portions other than the light-receiving regions are shaded from the light by an Al film (not shown), the output voltage profile of the photodiode e appears as shown by the thick solid line in FIG. 9A. Leakage shown by an arrow in FIG. 9A is an output appearing at the photodiode e when light enters in the photodiode a, and a responsive focus error signal mixes into the tracking error signal.

Figure 9B:
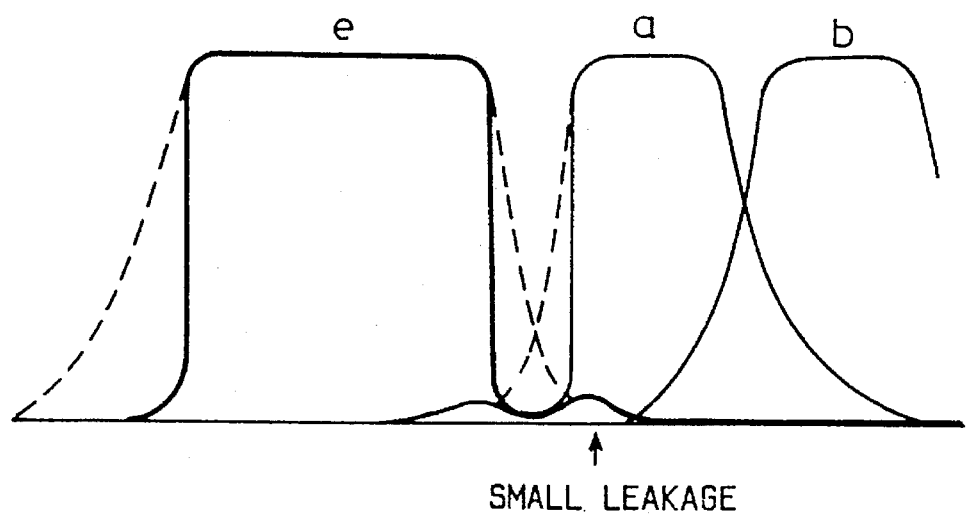

On the other hand, profiles of output voltages from the photodetector in the photo IC according to the first embodiment are shown in FIG. 9B. As shown in FIG. 9B, leakage shown by an arrow is decreased to a half from that of FIG. 9A, which means an improvement in the output voltage profiles.

Figure 10A:
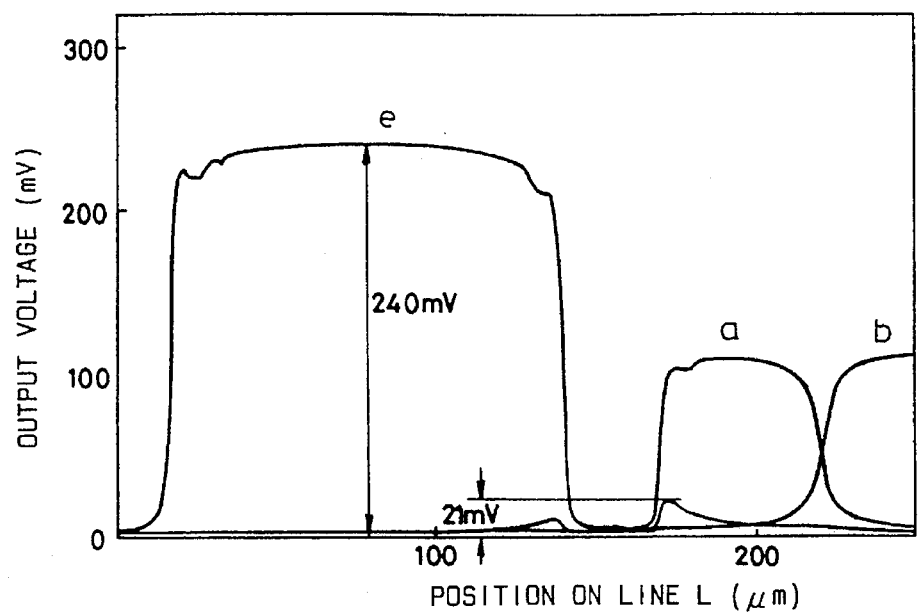
FIGS. 10A and 10B are graphs showing a result of measurement of output voltage profiles of the photodiodes in the existing photo IC and a result of measurement of output voltage profiles of the photodiodes in the photo IC according to the first embodiment of the invention.
Figure 10B:
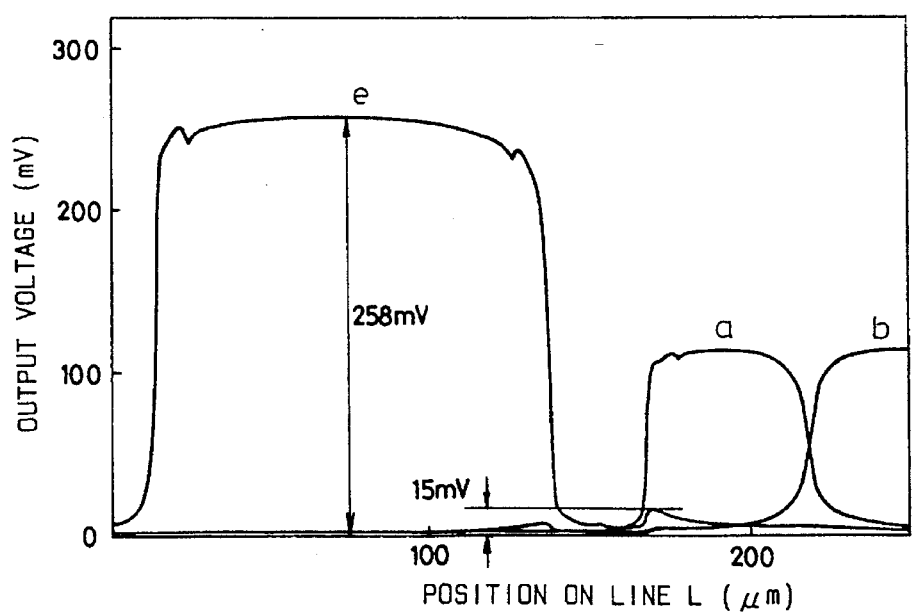

Shown in FIGS. 10A and 10B is a result of actual measurement of output voltage profiles. FIG. 10A corresponds to FIG. 9A, and FIG. 10B corresponds to FIG. 9B. Laser beam power is 3.5 µW in both cases.

The result of measurement shows that, with the existing photodetector, the maximum value of the output signal voltage of the photodiode e is 240 mV and the leakage of the output voltage is 21 mV; however, with the photodetector in the photo IC according to the first embodiment, the maximum value of the output signal voltage of the photodiode e is 258 mV and the leakage of the output voltage is 15 mV. Thus the ratio of the leakage of output voltage relative to the maximum signal voltage value has been improved from 8.8% to 5.8%.

Figure 11:
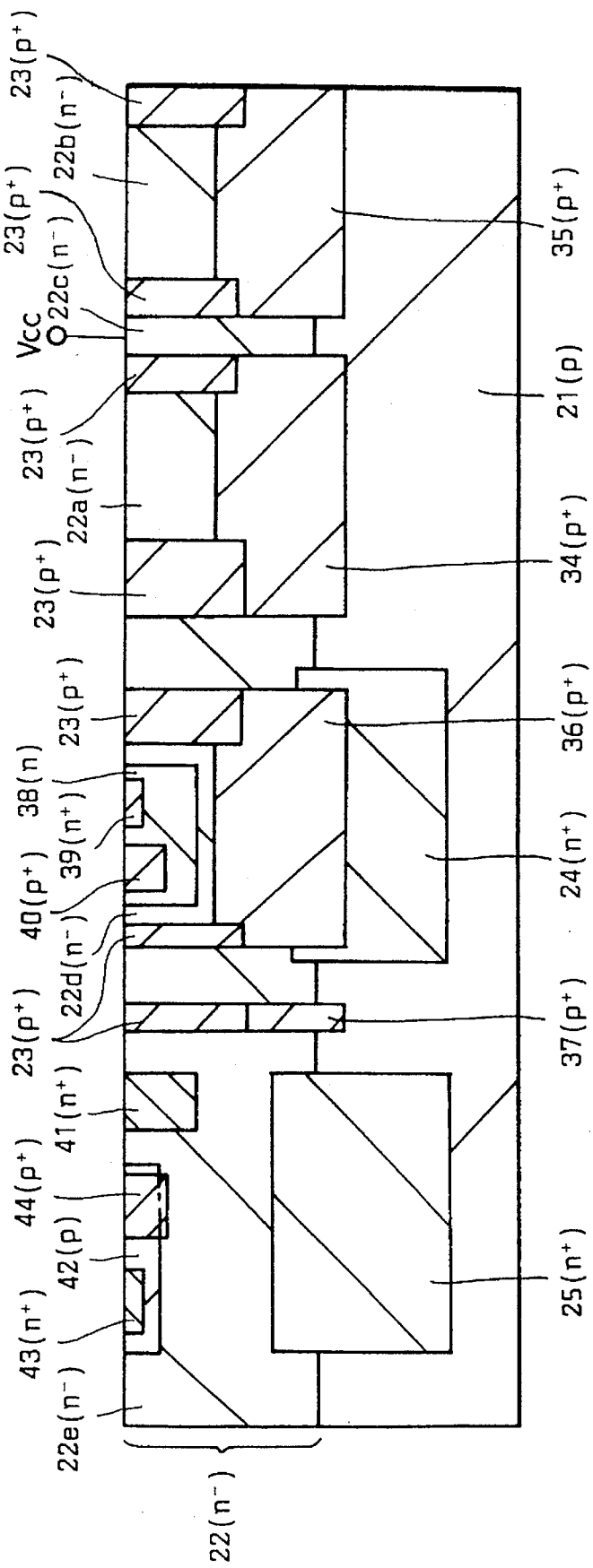
FIG. 11 is a cross-sectional view of construction of a photo IC according to a second embodiment of the invention.

FIG. 11 is a cross-sectional view showing construction of a photo IC according to a second embodiment of the invention.

As shown in FIG. 11, in the photo IC according to the second embodiment, $n^+$-type buried layers 34 and 35 are provided on the p-type semiconductor substrate 21 in the location of the photodetector portion. The $n^-$-type epitaxially grown layers 22a and 22b, $p^+$-type buried layers 34 and 35, and p-type semiconductor substrate 21 make photodiodes having the common anode. Apart from the illustration, six photodiodes are actually provided in the pattern shown in FIG. 1, like in the first embodiment.

In this case, like in the first embodiment, the $n^-$-type epitaxially grown layer 22c provided between the $n^-$-type epitaxially grown layers 22a and 22b via the $p^+$-type isolation region 23 behaves as the stray carrier absorbing region. The stray carrier absorbing region is coupled to the positive power source $V_{cc}$.

In the electronic circuit portion of the photo IC, a $p^+$-type buried layer 36 is provided in the $n^-$-type epitaxial layer 22d. Additionally, a $p^+$-type buried layer 37 is provided under one of the $p^+$-type isolation region 23, and an n-type semiconductor region 38 is formed in the $n^-$-type epitaxially grown layer 22d located above the $p^+$-type buried layer 36. Formed in the n-type semiconductor region 38 are an $n^+$-type semiconductor region 39 and a $p^+$-type semiconductor region 40. These $p^+$-type semiconductor region 40, n-type semiconductor region 38, $n^-$-type epitaxially grown layer 22d and $p^+$-type buried layer 36 make a pnp transistor. The $n^+$-type semiconductor region 39 is used as the base contact layer of the transistor.

Furthermore, provided in the $n^-$-type epitaxially grown layer 22e located above the $n^+$-type buried layer 25 are an $n^+$-type semiconductor region 41, p-type semiconductor region 42, $n^+$-type semiconductor region 43 and $p^+$-type semiconductor region 44. These $n^+$-type semiconductor region 43, p-type semiconductor region 42, and $n^-$-type epitaxially grown layer 22e make an npn transistor. The $n^+$-type semiconductor region 41 is used as the collector contact layer of the transistor, and the $p^+$-type semiconductor region 44 is used as the base contact layer.

In the second embodiment, the $n^-$-type epitaxially grown layers 22a and 22b located above the $p^+$-type buried layers 34 and 35 are 2.5 µm thick, for example, the $p^+$-type isolation region 23 in the photodetector portion is 6 µm wide, for example, and the $n^-$-type epitaxially grown layer 22c behaving as the stray carrier absorbing region is 20 µm wide, for example. Impurity concentration of the p-type semiconductor substrate 21 is $10^{15}$~$10^{16}$ cm$^{-3}$, for example, and impurity concentration of the $p^+$-type buried layers 34 and 35 is $10^{18}$~$10^{19}$ cm$^{-3}$ for example.

In the photo IC according to the second embodiment, since the $n^-$-type epitaxially grown layer 22c is provided as the stray carrier absorbing region between respective adjacent photodiodes, electrons, in particular, of stray carriers generated by incidence of light can be absorbed into the stray carrier absorbing region, and crosstalk between respective adjacent photodiodes can be reduced. Furthermore, since the $p^+$-type buried layers 34 and 35 with a high impurity concentration are provided between the p-type semiconductor substrate 21 and the $n^-$-type epitaxially grown layers 22a and 22b, respectively, electrons in the stray carriers generated in the $p^+$-type buried layers 34 and 35 due to incidence of light are shortened in life, and the crosstalk between photodiodes can be more effectively reduced.

Additionally, according to the second embodiment, because the photodiodes have $n^-$-$p^+$ junctions, they have good frequency characteristics, and exhibit a high speed response in 30 MHz, for example.

Figure 12:
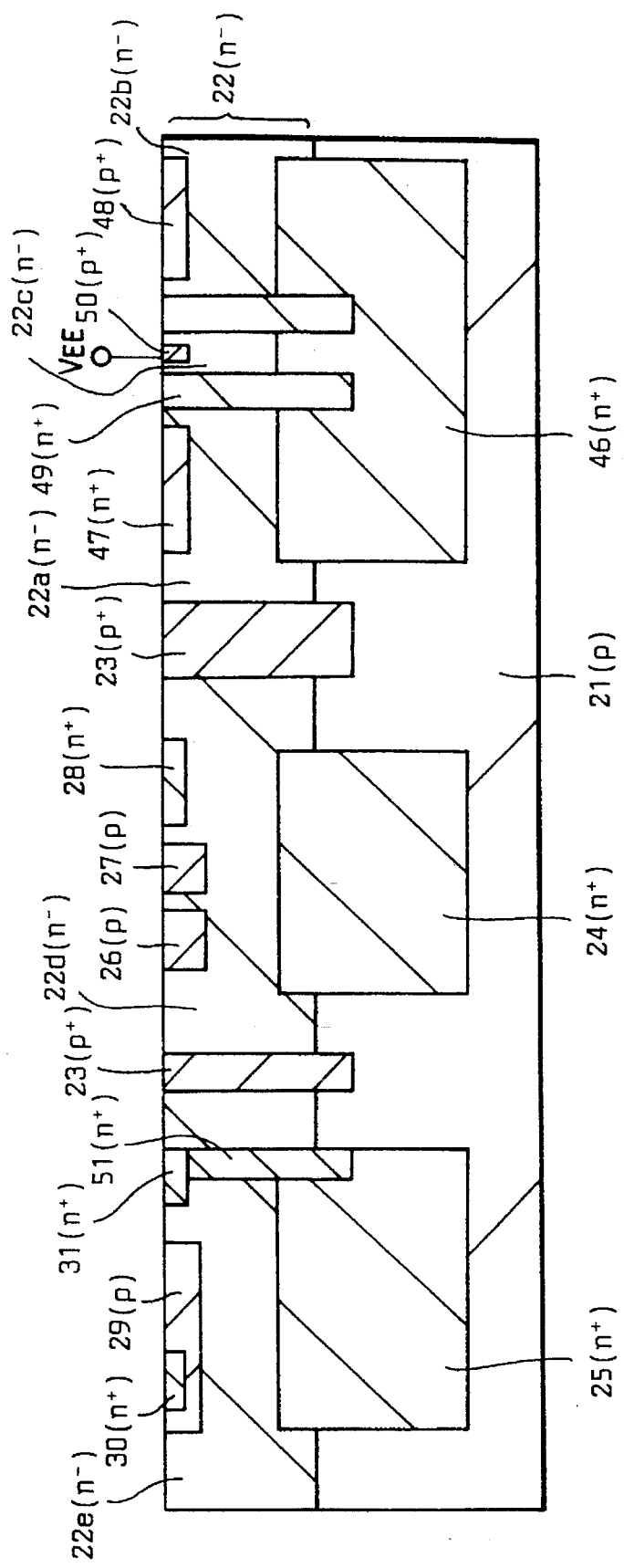
FIG. 12 is a cross-sectional view showing construction of a photo IC according to a third embodiment of the invention.

FIG. 12 is a cross-sectional view showing construction of a photo IC according to a third embodiment of the invention.

As shown in FIG. 12, in the photo IC according to the third embodiment, an $n^+$-type buried layer 46 is provided on the p-type semiconductor substrate 21 in the location of the photodetector. A $p^+$-type semiconductor region 47 is provided in the $n^-$-type epitaxially grown layer 22a located above one end of the $n^+$-type buried layer 46, and a $p^+$-type semiconductor region 48 is provided in the $n^-$-type epitaxially grown layer 22b located above the other end of the $n^+$-type buried layer 46. These $p^+$-type semiconductor regions 47, 48, $n^-$-type epitaxially grown layers 22a and 22b, and $n^+$-type buried layer 46 make photodiodes having the common cathode. The photodetector actually include six photodiodes of the pattern shown in FIG. 1.

In this construction, the $n^-$-type epitaxially grown layer 22c is provided between the $n^-$-type epitaxially grown layers 22a and 22b via an n$^+$-type semiconductor region 49, and a p$^+$-type semiconductor region 50 as the stray carrier absorbing region is formed in the n$^-$-type epitaxially grown layer 22c. The p$^+$-type semiconductor region 50 behaving as the stray carrier absorbing region is coupled to a negative power source V$_{EE}$.

Construction of the electronic circuit portion of the photo IC according to the third embodiment is identical to that of the photo IC according to the first embodiment except for an n$^+$-type semiconductor region 51 being provided in the n$^-$-type epitaxially grown layer 22e so as to couple the n$^+$-type buried layer 25 and the n$^+$-type semiconductor region 31.

In the third embodiment, impurity concentration of the p$^+$-type semiconductor region 50 as the stray carrier absorbing region is $10^{18}$–$10^{19}$ cm$^{-3}$ or $10^{19}$–$10^{20}$ cm$^{-3}$.

In the photo IC according to the third embodiment, since the p$^+$-type semiconductor region 50 is provided as the stray carrier absorbing region between respective adjacent photodiodes, holes of stray carriers generated by incidence of light can be absorbed into the p$^+$-type semiconductor region 50, and crosstalk between respective adjacent photodiodes can be reduced.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

Figure 13:
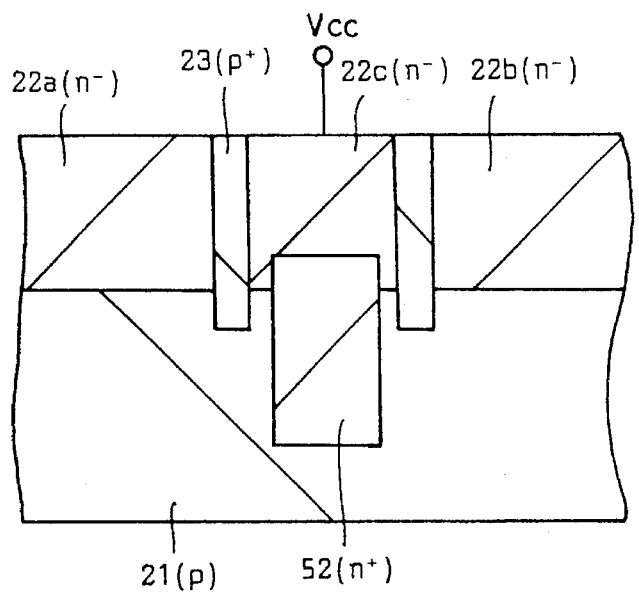
FIG. 13 is a cross-sectional view showing construction of a photo IC according to a fourth embodiment as modified from the first embodiment.
Figure 14:
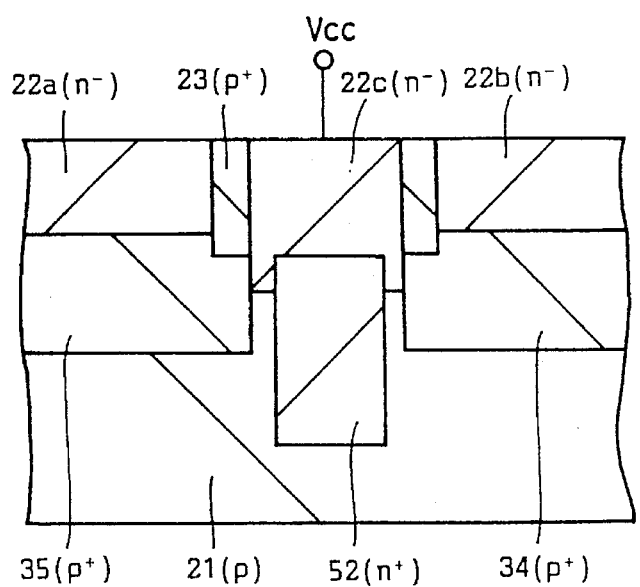
FIG. 14 is a cross-sectional view showing construction of a photo IC according to a fifth embodiment of the invention as modified from the second embodiment.

For example, as shown in FIG. 13, by providing an n$^+$-type buried layer 52 under the n$^-$-type epitaxially grown layer 22c provided in the photodetector portion of the photo IC according to the first embodiment to behave as the stray carrier absorbing region, the photodetector may be modified so that stray carriers generated by incidence of light can be more readily absorbed into the n$^-$-type epitaxially grown layer 22c as the stray carrier absorbing region. Likewise, as shown in FIG. 14, an n$^+$-type buried layer 52 may be provided under the n$^-$-type epitaxially grown layer 22c in the photo IC according to the second embodiment.

As explained above, the invention, providing the stray carrier absorbing region between adjacent photodiodes, can reduce crosstalk between the photodiodes even in a construction with a plurality of photodiodes incorporated with an integrated circuit into a single chip.

What is claimed is:

1. A semiconductor device comprising:

a semiconductor body of a first conductivity type;

a plurality of semiconductor layers of a second conductivity type provided on said semiconductor body of the first conductivity type and electrically isolated from each other; and said semiconductor body of the first conductivity type and said semiconductor layers of the second conductivity type making a plurality of photodiodes, wherein a semiconductor region of the second conductivity type is provided between at least one pair of adjacent ones of said semiconductor layers of the second conductivity type to absorb stray carriers.

2. The semiconductor device according to claim 1 wherein semiconductor layers of the first conductivity type with a higher impurity concentration than that of said semiconductor body of the first conductivity type are provided between said semiconductor layers of the second conductivity type and said semiconductor body of the first conductivity type.

3. The semiconductor device according to claim 1 or 2 wherein said first conductivity type is p-type, and said second conductivity type is n-type.

4. A semiconductor device comprising:

a semiconductor body of a first conductivity type;

a first semiconductor layer of a second conductivity type provided on said semiconductor body of the first conductivity type;

a plurality of second semiconductor layers of the second conductivity type provided on said first semiconductor layer of the second conductivity type and electrically isolated from each other;

a plurality of semiconductor layers of the first conductivity type respectively provided in said second semiconductor layers of the second conductivity type;

said second semiconductor layers of the second conductivity type and said semiconductor layers of the first conductivity type making a plurality of photodiodes; and said first semiconductor layers of the second conductivity type having a higher impurity concentration than that of said second semiconductor layers of the second conductivity type;

wherein a semiconductor region of the first conductivity type is provided between at least one pair of adjacent ones of said second semiconductor layers of the second conductivity type to absorb stray carriers.

5. The semiconductor device according to claim 4 wherein said first conductivity type is p-type, and said second conductivity type is n-type.

* * * * *